United States Patent
Kato et al.

(10) Patent No.: US 6,491,836 B1
(45) Date of Patent: Dec. 10, 2002

(54) SEMICONDUCTOR WAFER AND PRODUCTION METHOD THEREFOR

(75) Inventors: Tadahiro Kato, Nishishirakawa-gun (JP); Sadayuki Okuni, Nishishirakawa-gun (JP); Shunichi Ikeda, Nishishirakawa-gun (JP); Keiichi Okabe, Koshoku (JP); Hisashi Oshima, Nakakubiki-gun (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 0 days.

(21) Appl. No.: 09/582,434
(22) PCT Filed: Nov. 1, 1999
(86) PCT No.: PCT/JP99/06075
§ 371 (c)(1), (2), (4) Date: Jun. 26, 2000
(87) PCT Pub. No.: WO00/28583
PCT Pub. Date: May 18, 2000

(30) Foreign Application Priority Data

Nov. 6, 1998 (JP) .......................................... 10-316290

(51) Int. Cl.$^7$ ............................................. H01L 21/302
(52) U.S. Cl. .................... 216/88; 216/89; 438/691; 438/692; 438/745; 451/41
(58) Field of Search .................... 216/88, 89; 438/691, 438/692, 745; 451/41; 428/446

(56) References Cited

U.S. PATENT DOCUMENTS

| | | | | |
|---|---|---|---|---|
| 5,494,862 A | * | 2/1996 | Kato et al. | 438/693 |
| 5,942,445 A | * | 8/1999 | Kato et al. | 438/691 |
| 6,234,873 B1 | * | 5/2001 | Yamamoto et al. | 216/88 |

FOREIGN PATENT DOCUMENTS

| | | |
|---|---|---|
| JP | A-9-260314 | 10/1997 |
| JP | A-10-189502 | 7/1998 |
| JP | A-11-31670 | 2/1999 |
| JP | A-11-135474 | 5/1999 |

* cited by examiner

*Primary Examiner*—Felisa Hiteshew
*Assistant Examiner*—Shamim Ahmed
(74) *Attorney, Agent, or Firm*—Oliff & Berridge, PLC

(57) ABSTRACT

A method for producing a semiconductor wafer that yields a wafer having high flatness and back surface characteristics to address problems concerning the back surface of a wafer produced by the conventional surface grinding/double side polishing method and observed during the production process. The method comprises flattening both sides of the wafer by surface grinding means, eliminating a mechanically damaged layer by an etching treatment, and then subjecting a front surface of the wafer to a single side polishing treatment, wherein a back surface of the wafer has glossiness in a range of 20–80%.

18 Claims, 7 Drawing Sheets

BONDING MATERIAL AND COUNT OF DIAMOND GRINDING STONE

WAFER ROTATION NUMBER AND GRINDING STONE ROTATION NUMBER

PROCESS III
(LAPPING/SINGLE SIDE POLISHING METHOD)

SEMICONDUCTOR WAFER AND PRODUCTION METHOD THEREFOR

TECHNICAL FIELD

The present invention relates to a method for producing a semiconductor wafer, in particular, a single crystal silicon wafer.

BACKGROUND ART

Conventional methods for producing semiconductor wafers generally comprise, as shown in Process III of FIG. 10 (henceforth this process is also referred to as "lapping/single side polishing method"), a slicing step to obtain a wafer of thin disc shape by slicing a single crystal silicon ingot pulled in a single crystal pulling apparatus; a chamfering step to chamfer a peripheral edge portion of the sliced wafer to prevent cracking or breakage of the wafer; a lapping step to flatten the surface of the chamfered wafer; a wet etching step to remove a mechanically damaged layer of the wafer remained after the chamfering and the lapping; a single side polishing step to finish one side of the etched wafer so that the wafer should have a mirror surface; and a cleaning step to clean the polished wafer to remove the polishing agent or dust particles remained on the wafer to improve the cleanliness of the wafer.

In view of recent use of semiconductors of higher functionality or higher performance, extremely smaller size, lighter weight and higher integration degree, higher quality and lower cost of base material wafers have been pursued. However, it is difficult to obtain flatness with high precision for wafers having, in particular, a large diameter of 200-300 mm or more, and reduction of production costs has almost reached its limitation.

Therefore, methods for processing wafers that can realize higher flatness and lower cost for the next generation have been actively developed. For example, there has been proposed a production method utilizing a combination of surface grinding and double side polishing (see Japanese Patent Laid-open Publication (Kokai) No. 9-260314).

This method makes it easy to obtain flatness and thickness with higher precision by utilizing a surface grinding step as shown in Process IV of FIG. 11 (henceforth this process is also referred to as "surface grinding/double side polishing method") instead of the lapping step of Process III. Moreover, since this method can easily be automated, it also makes possible to markedly reduce man-day or man-hour of workers. In addition, there has also been developed a method for simultaneously grinding both sides in order to eliminate undulation components of a long period of 0.5 to 30 mm, which are generated in cutting with a wire saw or an inner diameter slicer, and of which removal has hitherto constituted a developmental object.

Moreover, the double side polishing means also has an advantage that it affords flatness of higher precision compared with the conventional one side polishing.

In the second surface grinding step of the aforementioned Process IV, in general, the grinding processing is separately performed for the front surface and the back surface by using the same grinding stone or the same grinding conditions. The processing traces on the front surface and the back surface caused by the surface grinding are removed by performing double side polishing.

By the way, although double side polished wafers produced in Process IV having the aforementioned advantages are excellent in flatness and so forth, they have a history that they have not accepted by device manufacturers so far. As the reason for this, the following three reasons can be mentioned.

First, when the presence of a wafer was confirmed by sensing the back surface of the wafer during the device production process, if characteristics of the back surface of the wafer such as glossiness and surface roughness are changed from those of conventional ones, sensing sensitivity must be readjusted. Such readjustment for sensing must be performed for the whole long process consisting of several tens of steps. Therefore, alteration of back surface characteristics shall be accompanied by serious obstructions.

Secondly, the back surface of the wafer subjected to the double side polishing so that it should have a mirror surface suffers high contact area ratio during back surface chucking, handling and so forth. Therefore, it is likely to receive contamination from a transportation system and so forth, and hence considerable improvement of cleanliness degree is required for the transportation system, and it constitutes a new technical problem. Moreover, it is also pointed out that sliding of wafer occurs in transportation and alignment because the back surface is made into a mirror surface.

Thirdly, it has also found that change of substantial surface area or contact area of the wafer back surface may cause serious phenomena, for example, temperature control may be deviated in the dry etching step, ion implantation step and so forth. In order to minimize the change of process steps for device production, characteristics required for wafers must be comparable to those of back surfaces of conventional wafers produced by Process III (lapping/single side polishing method). Specifically, the back surface glossiness must be within the range of 20–80% so that the back surface and the front surface can easily be distinguished.

Furthermore, even if the double side polishing of Process IV (see FIG. 11) is replaced with single side polishing, that is, even if a non-mirror surface subjected to etching treatment after grinding is left on the wafer back surface, glossiness of the back surface would exceed 80%, when the back surface is ground by using the same grinding stone or the same grinding conditions as the surface grinding, in which the ground surface is intended to be removed by polishing. Thus, the same problems as a mirror surface may be caused. This is exactly because the surface grinding conditions are constituted by selection of grinding stone and grinding conditions optimized so that the surface can easily be made into a mirror surface in the subsequent polishing step.

DISCLOSURE OF THE INVENTION

The present invention was accomplished in view of the problems of the conventional techniques mentioned above, and its major object is to provide a method for producing a semiconductor wafer that has high flatness and back surface characteristics that can solve the problems concerning the back surface of a wafer having high glossiness for both sides that is produced by the conventional surface grinding/double side polishing method and observed during the device production process, and to provide a semiconductor wafer having such characteristics.

In order to achieve the aforementioned object, the present invention provides a semiconductor wafer obtained by a process comprising at least flattening both sides of the wafer by surface grinding means, eliminating a mechanically damaged layer by an etching treatment; and then subjecting the wafer to a single side polishing treatment, wherein a back surface of the wafer has glossiness in a range of 20–80%.

This wafer is a wafer that has excellent flatness for the both sides and different surface conditions for the front surface and the back surface. For example, the front surface is finished as a mirror surface having a glossiness of 90–100%, and the back surface is finished to have a glossiness of 20–80%. Such a wafer surely eliminates the obstructions observed for wafers produced by the conventional surface grinding/double side polishing method during the device production process, for example, need of readjustment of sensing sensitivity, indistinguishability of front surface and back surface, separation failure after vacuum sucking, contamination during transportation, bad temperature control and so forth. Therefore, it can improve productivity and yield and markedly reduce the cost of the device production process.

The present invention also provides a method for producing a semiconductor wafer, which comprises at least cutting out a wafer by slicing a semiconductor ingot, simultaneously grinding both of front surface and back surface of the wafer, then flattening the wafer by surface grinding means for separately grinding the front surface and the back surface under different conditions, removing a mechanically damaged layer by an etching treatment while maintaining flatness, and then subjecting the wafer to a single side polishing treatment.

By such a process for producing a wafer comprising simultaneous surface grinding of both sides, separate surface grinding for each of front surface and back surface, etching and single side polishing, a wafer having higher flatness can be produced with a lower cost compared with the conventional lapping/single side polishing method. Further, a back surface with desired low glossiness can easily be provided at low cost, in contrast to the drawback of the double side polished wafers, i.e., the high glossiness of the back surface.

Therefore, a wafer processed by the method of the present invention is a wafer having excellent flatness for the both sides, and different roughness conditions for the front surface and the back surface. For example, it can be finished to have a mirror surface of high glossiness for the front surface and desired low glossiness for the back surface. Such a wafer eliminates the obstructions in the device production process caused by wafers produced through the conventional surface grinding/double side polishing method, for example, need of readjustment of sensing sensitivity, indistinguishability of front surface and back surface, bad separation after vacuum sucking, contamination during transportation, bad temperature control and so forth. Therefore, productivity, yield and cost of the device production process can markedly improved.

The present invention further provides a method for producing a semiconductor wafer, which comprises at least cutting out a wafer by slicing a semiconductor ingot, simultaneously grinding both of front surface and back surface of the wafer, then flattening the surface by surface grinding means for grinding only the front surface under a condition different from the condition for the simultaneous grinding of both of the front surface and the back surface, removing a mechanically damaged layer by an etching treatment while maintaining flatness, and then subjecting the wafer to a single side polishing treatment.

Since low glossiness of the back surface is attained also by this method, a wafer with high flatness can easily be produced at low cost without significantly altering quality of the back surface compared with those of conventional wafers. Therefore, the various obstructions in the device production process can be overcome, and productivity, yield and cost of devices can markedly be improved.

In this case, as the grinding means, there can be used a double head grinding apparatus which can simultaneously grind both of the front surface and the back surface of the wafer, and a surface grinding apparatus which can grind the front surface and the back surface of the wafer with distinct conditions.

By using such a double-step grinding process, i.e., first simultaneously grinding both of the front surface and the back surface by a double head grinding apparatus to obtain high flatness for the both sides, and then grinding the front surface and the back surface with distinct conditions to give difference of surface roughness for the front surface and back surface, the wafer can be finished by the subsequent etching and polishing treatments so as to have a highly glossy front surface and a back surface of low glossiness.

In this case, the wafer is preferably subjected to chamfering before the surface grinding of the both sides.

By chamfering as described above, cracking and fractures such as chips of wafers during the grinding and polishing can be prevented.

Further, the etching treatment of the aforementioned method is preferably performed as wet etching using an alkali solution as an etching solution.

In the manner described above, the mechanically damaged layer of the wafer can be removed, while high flatness obtained by the double side surface grinding and the single side surface grinding is maintained, and the polishing can efficiently be performed in the subsequent single side polishing treatment while the quality obtained after the grinding is maintained. The etching treatment of the wafer can be performed in such a degree that a minimum stock removal for only the mechanically damaged layer should be removed.

As described above, a semiconductor wafer which has a front surface exhibiting high flatness and high glossiness and a back surface exhibiting glossiness within the range of 20–80% can easily be produced at low cost according to the present invention. Therefore, because a wafer produced according to the present invention has the back surface characteristics substantially comparable to those of a wafer obtained by the conventional lapping/single side polishing method, it eliminates the need for readjustment of sensor sensitivity for sensing the presence or absence of the wafer, enables clear differentiation between the front surface and the back surface of wafer and surer temperature control, and reduces contamination of the back surface caused by the transportation system. Thus, it can sufficiently meet to the requirements for realizing higher integration degree in the device production process, and it can improve productivity and yield of the device production process, and markedly improve the cost.

BEST MODE FOR CARRYING OUT THE INVENTION

Embodiments of the present invention will be explained hereafter. However, the present invention is not limited to these.

The inventors of the present invention searched and investigated the cause of the fact that semiconductor wafers with mirror polished surfaces for the both sides were not accepted by device manufacturers. As a result, they found that such wafers have not been accepted because of the following history. That is, because such wafers have back surface characteristics different from those of conventional wafers, they require readjustment of sensing sensitivity in the device production step, and it constitutes a serious obstruction. Further, they suffer high contact area ratio during the back surface chucking and handling of them. Therefore, they are likely to suffer from contamination from the transportation system and so forth, and there is caused a phenomenon of deviated temperature control during the device production process due to the change of substantial surface area of the back surface. Thus, the device manufacturers must inevitably alter the process steps.

Therefore, the inventors of the present invention investigated and performed experiments about the front and back surface characteristics of wafers, and found that, if wafers have back surface glossiness within a range of 20 to 80%, they can obviate the aforementioned various obstructions in the device production process as wafers having different characteristics for the front surface and the back surface, which makes it possible to distinguish the front surface and the back surface, and also found that wafers having such back surface glossiness as well as high flatness can be produced by using the double side grinding and the single side polishing in combination and optimizing the conditions of the combinatory process. Thus, they investigated various conditions for the process, and accomplished the present invention.

Figure 1:
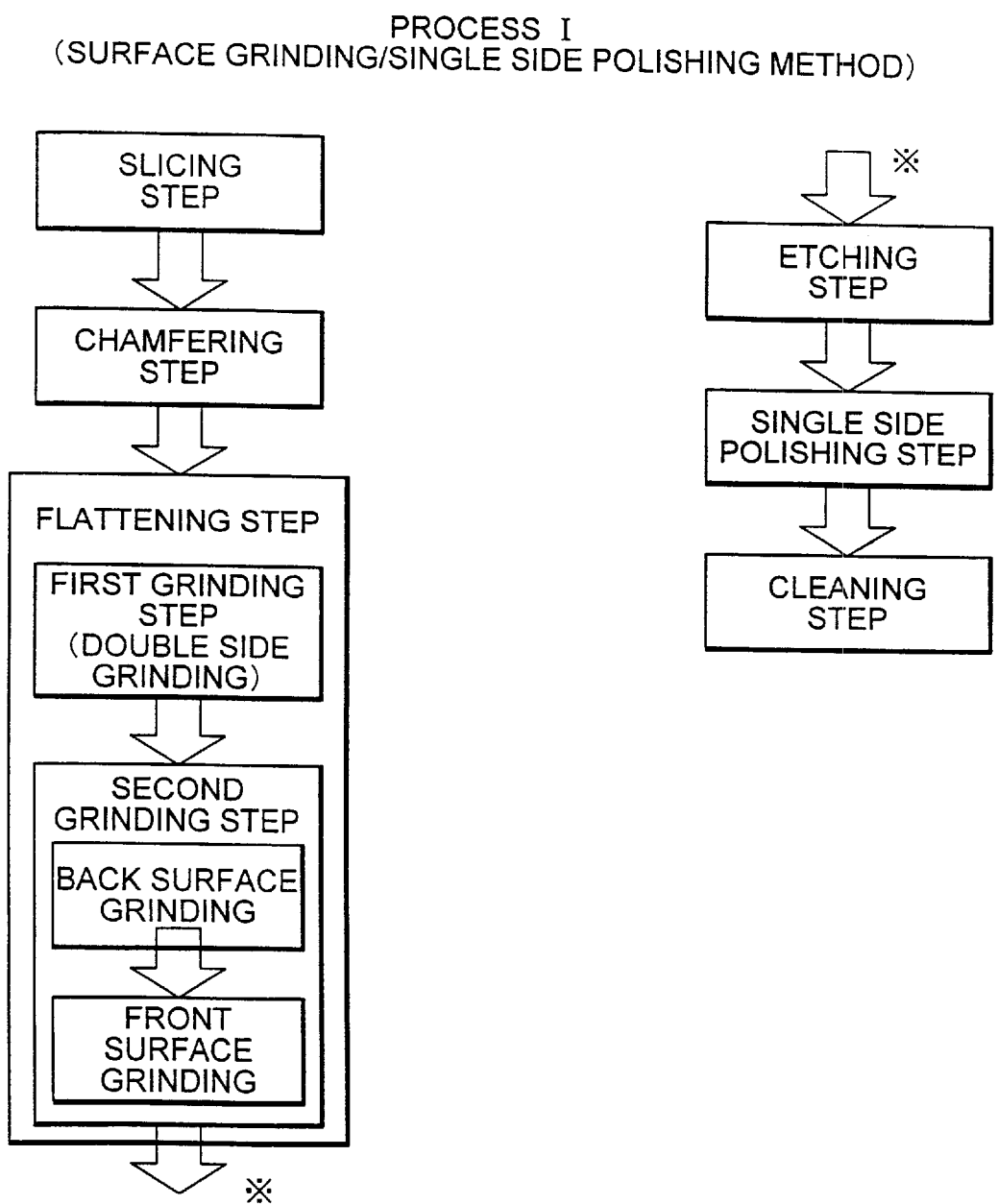
FIG. 1 is a flowchart explaining a production process for producing a semiconductor wafer from a semiconductor ingot according to the present invention.

First, Process I, which mainly consists of grinding and polishing steps, will be explained as an example of the method for producing a semiconductor wafer of the present invention by referring to the appended drawing. FIG. 1 is a flowchart for explaining the constructive outline of Process I.

Process I of the present invention mainly consists of the following six steps.

(1) A slicing step for cutting out a thin disk-like wafer from a single crystal ingot.

(2) A chamfering step for chamfering the sliced wafer.

(3) A flattening step for flattening the chamfered wafer, which consists of a first grinding step for simultaneously grinding both sides of the wafer by a double head grinding apparatus under the same condition and a second grinding step for separately grinding the front surface and the back surface of the wafer by a surface grinding apparatus. In the first grinding step, undulation components having a period of 0.5 to 30 mm of the wafer cut out by a wire saw or an inner diameter slicer are eliminated, and the both surfaces are finished so that they should have substantially the same characteristics. In the second grinding step, the front surface and the back surface of the wafer are separately ground by a surface grinding apparatus under different conditions. For example, the back surface is ground first under a condition for obtaining low glossiness, and then the front surface is ground under a condition for obtaining high glossiness.

(4) An etching step for eliminating grinding dusts and mechanically damaged layer produced during the flattening on the front surface and back surface of the wafer with an alkaline solution while maintaining the flatness.

(5) A single side polishing step for performing mirror surface processing of the front surface of the wafer after the etching.

(6) A cleaning step for cleaning the wafer after the polishing treatment and drying it.

As another example, steps of Process II will be explained by referring to FIG. 2.

Process II of the present invention mainly consists of the following six steps.

(1) A slicing step for cutting out a thin disk-like wafer from a single crystal ingot.

(2) A chamfering step for chamfering the sliced wafer.

(3) A flattening step for flattening the chamfered wafer, which consists of a first grinding step for simultaneously grinding both sides of the wafer by a double head grinding apparatus under the same condition and a second grinding step for grinding the front surface of the wafer by a surface grinding apparatus. In the first grinding step, undulation components having a period of 0.5 to 30 mm of the wafer cut out by a wire saw or an inner diameter slicer are eliminated under a grinding condition for obtaining low glossiness, and the both sides are finished so that they should have substantially the same characteristics. In the second grinding step, only the front surface is ground by a surface grinding apparatus under a condition for obtaining high glossiness, which is different from the condition for the simultaneous grinding of the both sides.

(4) An etching step for eliminating grinding dusts and mechanically damaged layer produced during the flattening on the front surface and back surface of the wafer with an alkaline solution while maintaining the flatness.

(5) A single side polishing step for performing mirror surface processing of the front surface of the wafer after the etching.

(6) A cleaning step for cleaning the wafer after the polishing treatment and drying it.

Now, the grinding apparatus and the polishing apparatus used for the present invention as well as processing conditions therefor will be explained.

Figure 3:
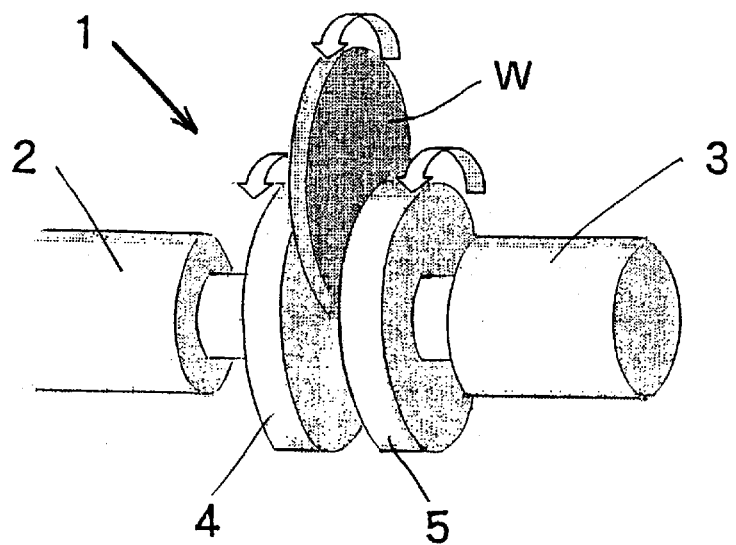
FIG. 3 is a schematic explanatory view of an exemplary double head grinding apparatus for double side grinding used in the present invention.

An example of the double head grinding apparatus used for the first grinding step of the flattening step is shown in FIG. 3.

This double head grinding apparatus 1 is one called horizontal type double head grinding apparatus, and comprises a left side grinding stone 4 and a right side grinding stone 5, which are driven at a high speed by driving motors 2 and 3 on the left and right sides, respectively. An as-cut wafer, which is revolved by a non-illustrated rotating apparatus, is held on its both sides between the left and right grinding stones, and simultaneously ground for the both sides under the same condition. In this step, most of warpage and undulation of the as-cut wafer are eliminated so that the wafer should be processed to have high flatness, and thus a wafer not showing variation in thickness is formed.

Figure 4:
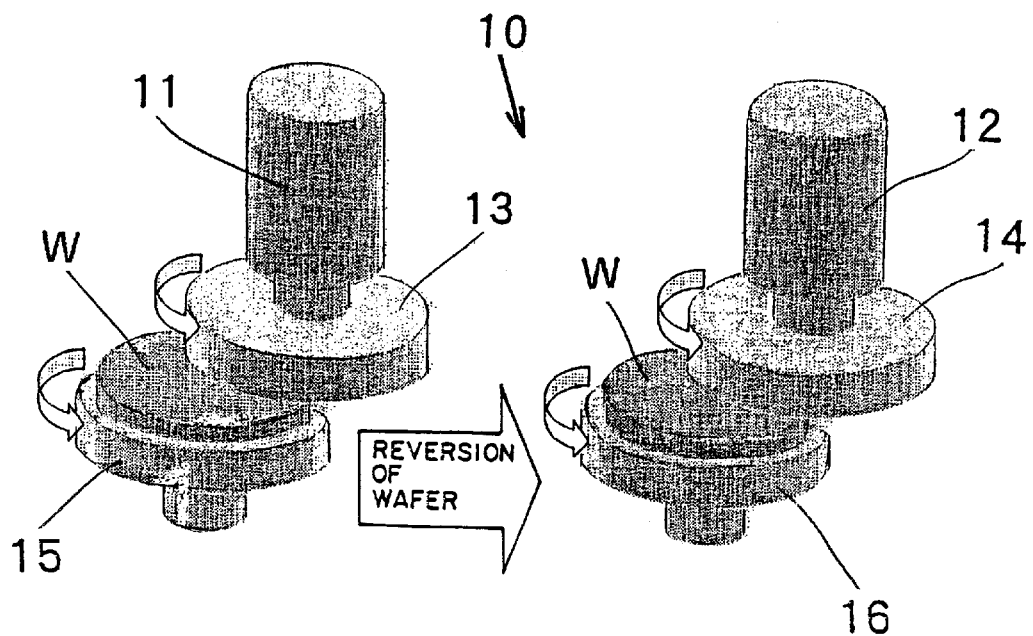
FIG. 4 is a schematic explanatory view of an exemplary surface grinding apparatus for single side grinding used in the present invention.

Now, an example of the surface grinding apparatus for single side grinding used in the second grinding step as the post-grinding step is shown in FIG. 4. This surface grinding apparatus 10 is one called vertical in-feed type surface grinder. In the grinding process using this apparatus, the aforementioned wafer W ground for the both sides is fixed on a first chucking plate 15 having a rotatable mechanism for sucking fixation, and the front surface or the back surface of the wafer is ground with a first cup type grinding stone 13 driven by a first driving motor 11 at a high speed with the wafer rotating. Then, the wafer W is reversed, fixed on a second chucking plate 16 having the same mechanism as the first one, and the front surface or the back surface is ground with a second grinding stone 14 driven by a second driving motor 12 at a high speed. The both sides of the wafer can be ground under different conditions by differentiating roughness of the first grinding stone 13 and the second grinding stone 14, or other conditions such as rotation speed.

In the second grinding step of Process II of the present invention, only the front surface may be ground by using a single shaft of the aforementioned surface grinding apparatus 10 under a condition different from the condition of the first grinding.

Tests for selecting suitable grinding stones for the surface grinding as a grinding condition for obtaining a front surface of high glossiness and a back surface of low glossiness will be explained.

The names of the grinding stones are designations of manufacturers, and do not represent their identities.

(Test 1)

The surface grinding was performed by changing the kind of grinding stone, and glossiness of back surface of each wafer was measured after etching. The wafers used were cut out from an ingot, and the chamfered silicon wafers had a diameter of 200 mm. The grinding stones used also had a diameter of 200 mm.

As for the surface grinding conditions, an in-feed type single side surface grinder was used for convenience with a workpiece rotation number of 3–5 rpm and a grinding stone rotation number of 2400–4800 rpm. These conditions are expressed as ranges, because a condition usually set for each of the grinding stones mentioned below as a standard condition was used.

As for the kind of grinding stone, 6 kinds of grinding stones, Metal #600, Metal #800, Vitrifide #2,000, Vitrifide #3,000, Vitrifide #8,000 and Resin #2,000, were used. All of the grinding stones used diamond abrasive grains.

Glossiness was measured at an incidence angle of 60° according to the method standardized by JIS Z8741 and so forth. As a standard of mirror surface glossiness, the value of mirror polished wafer surface was used, which was taken as 100%. The back surface glossiness was 80–90%, when Resin #2,000 was used, which was a grinding stone for highly precise surface grinding.

Figure 5:
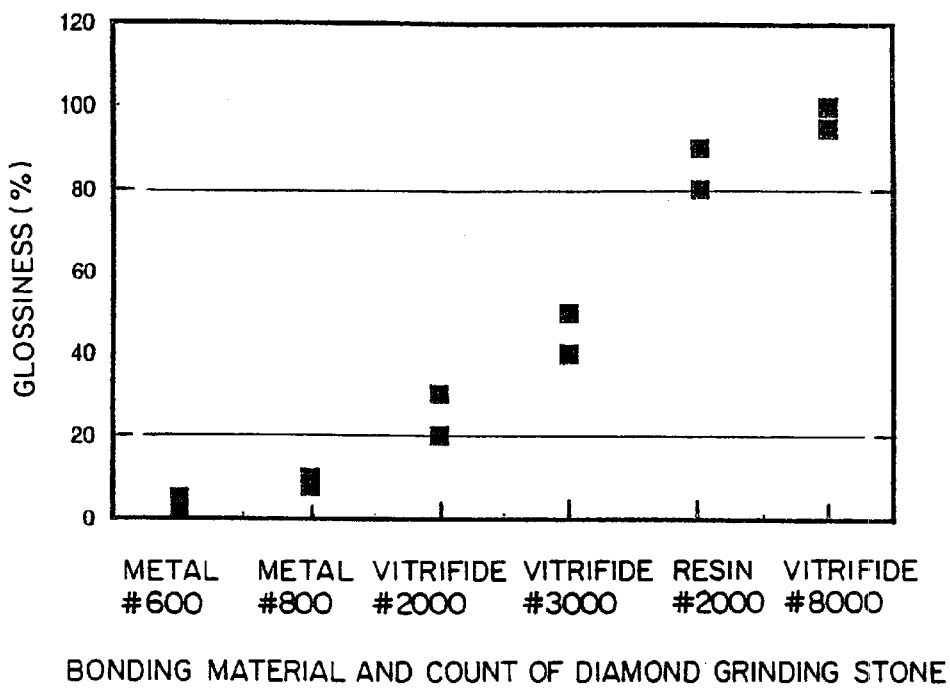
FIG. 5 is a graph representing the relationship between the kind of grinding stone used in the flattening step and glossiness of a wafer obtained after etching.

As a result, it was found that the target back surface glossiness of 20–80% could be attained by using a grinding stone corresponding to Vitrifide #2,000 or Vitrifide #3,000 as shown in FIG. 5.

Further, it was found that a grinding stone corresponding to Resin #2000 or Vitrifide #8,000 could be used for the front surface grinding as a high count grinding stone.

(Test 2)

Then, regarding a mechanical condition of surface grinding, back surface glossiness after etching was investigated. The grinding stone used was Vitrifide #3,000. As for the surface grinding conditions, an in-feed type single side surface grinder was used for convenience with a wafer rotation number of 3–40 rpm and a grinding stone rotation number of 2400–4800 rpm. The silicon wafers had a diameter of 200 mm. The grinding stone used had a diameter of 200 mm.

Figure 6:
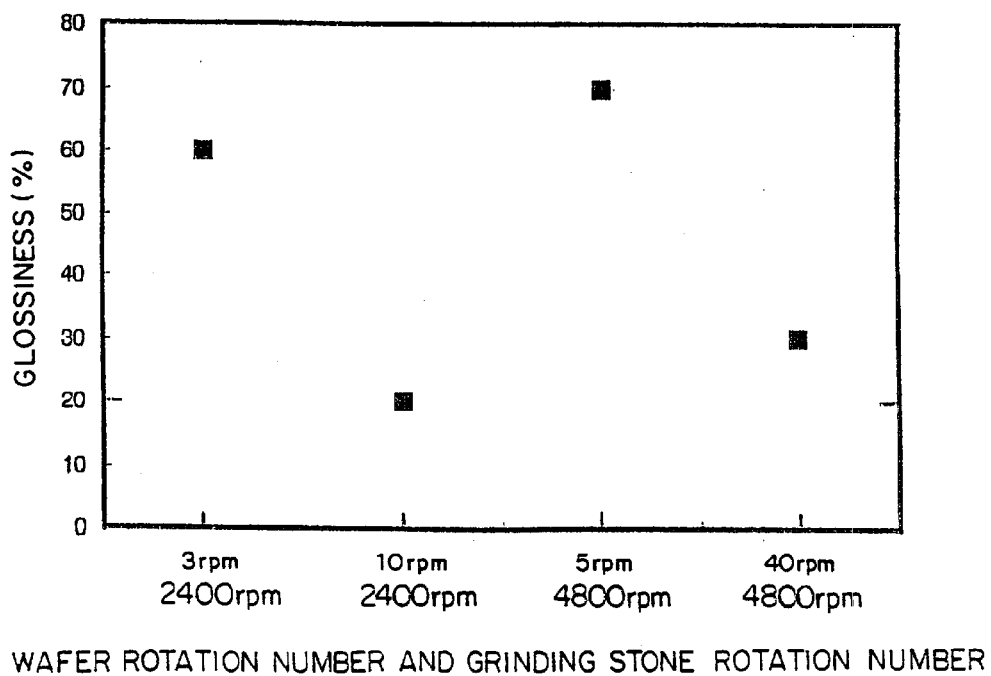
FIG. 6 is a graph representing the relationship between the surface grinding conditions (rotation number of wafer and peripheral speed of grinding stone) and glossiness of a wafer obtained after etching.

As a result, it was found that a smaller rotation number of the grinding stone and a higher rotation number of the wafer afforded lower back surface glossiness as shown in FIG. 6.

From the results mentioned above, it was found that a ground surface having desired back surface glossiness could be obtained by controlling (optimizing) the conditions of the grinding stone and mechanical grinding in addition to the selection of grinding stone in Test 1.

More precisely, the front surface grinding is preferably performed with a grinding stone of high count, which can reduce the surface roughness, so that a mirror surface can easily be obtained with a smaller polishing amount in the subsequent polishing step. It was found that a grinding stone corresponding to Resin #2000 or Vitrifide #8,000 is desirably used as a grinding stone of high count, and a combination of a higher grinding stone rotation number and a lower wafer rotation number is particularly suitable.

On the other hand, if the back surface is ground by using a grinding stone and grinding conditions similar to those of the grinding of the front surface, the back surface glossiness becomes extremely high.

The relationship between the kind of grinding stone and glossiness after the etching was already discussed above. Turning to the amount of etching, since the object of the etching is to remove the mechanically damaged layer, the etching amount should vary according to the variation of the depth of the mechanically damaged layer caused by difference of the grinding stone.

The depth of the mechanically damaged layer may be changed by count of grinding stone and hardness of bonding material for grinding stone and so forth, and it was confirmed by the inventor of the present invention in this test that a deeper mechanically damaged layer was obtained in the order of Metal #600>Metal #800>Vitrifide #2,000>Vitrifide #3,000>Resin #2,000>Vitrifide #8,000. That is, the amount of etching for removing the mechanically damaged layer becomes larger with a coarser grinding stone.

As represented in FIG. 5, glossiness after the etching exceeded 80% when Resin #2,000 was used for the surface grinding, and it is not preferred for the back surface from the viewpoints of the sensor and temperature control used in the device production step.

Glossiness of the surface ground with grinding stone of Vitrifide #2,000 or Vitrifide #3,000 after the etching is in the range of 20–60%. This is almost the same as that of the back surface glossiness obtained by the conventional Process III (lapping/single side polishing method) after etching, and causes almost no obstructions in the device production step.

The wet etching step used in the present invention must be able to remove the mechanically damaged layer formed on the wafer surface during the flattening step by the surface grinding means through chemical etching while maintaining the flatness attained in the flattening step as it is. A chemical solution used for this etching may degrade the flatness depending on its kind, stirring condition of the chemical solution and proceeding condition of the reaction during the etching. Therefore, the inventors of the present invention carefully repeated experiments, and found that an alkaline solution was extremely suitable, and a 45–50% aqueous solution of sodium hydroxide or potassium hydroxide was desirable.

The subsequent one side polishing step is a step for polishing only one side of a wafer having a stable thickness precision and flatness precision through a multi-step chemical mechanical polishing, which wafer has undergone the previous slicing step, chamfering step, flattening step and etching step.

Figure 8:
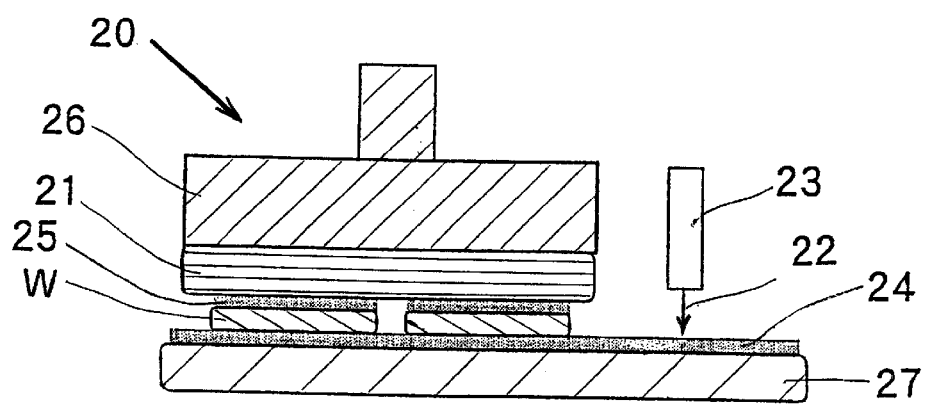
FIG. 8 is a schematic explanatory view of an exemplary single side polishing apparatus used in the present invention.

Various polishing schemes can be used for this single side polishing, and a method utilizing a polishing apparatus 20 shown in FIG. 8 can be mentioned, for example. In this method, a wafer W is fixed on its back surface to a holding disc 21 made from glass or ceramics set on a rotatable body 26 with an adhesive 25 such as wax which enables easy removal of the wafer in the subsequent cleaning step. A relative velocity is imparted to a polishing pad 24, which is composed of a polyurethane foam layer or the like and adhered on a polishing turn table 27, with an imposed load, while a polishing agent 22 comprising abrasive grains such as silica particles suspended in an alkali solution is fed from a nozzle 23, to perform chemical mechanical polishing only for the front surface of the wafer.

Figure 9:
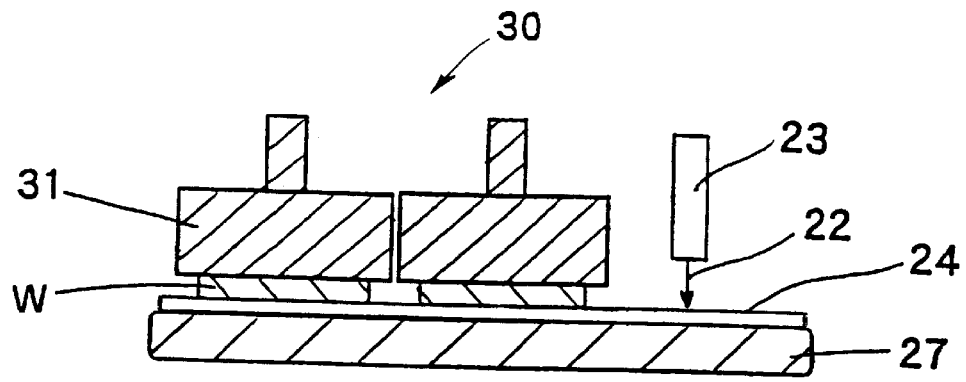
FIG. 9 is a schematic explanatory view of an exemplary vacuum sucking type polishing apparatus used in the present invention.
Figure 10:
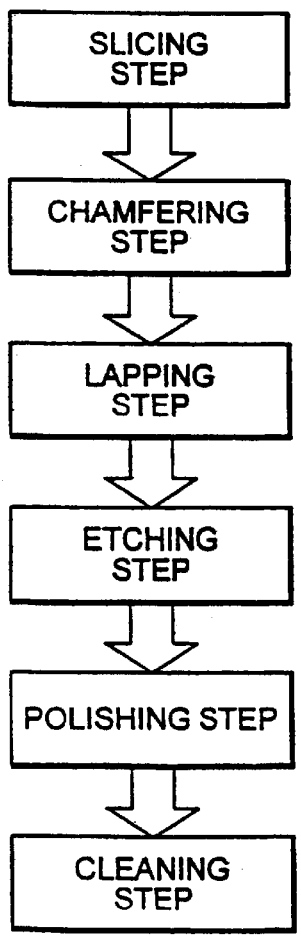
FIG. 10 is a flowchart representing a production process of the conventional lapping/single side polishing method.
Figure 11:
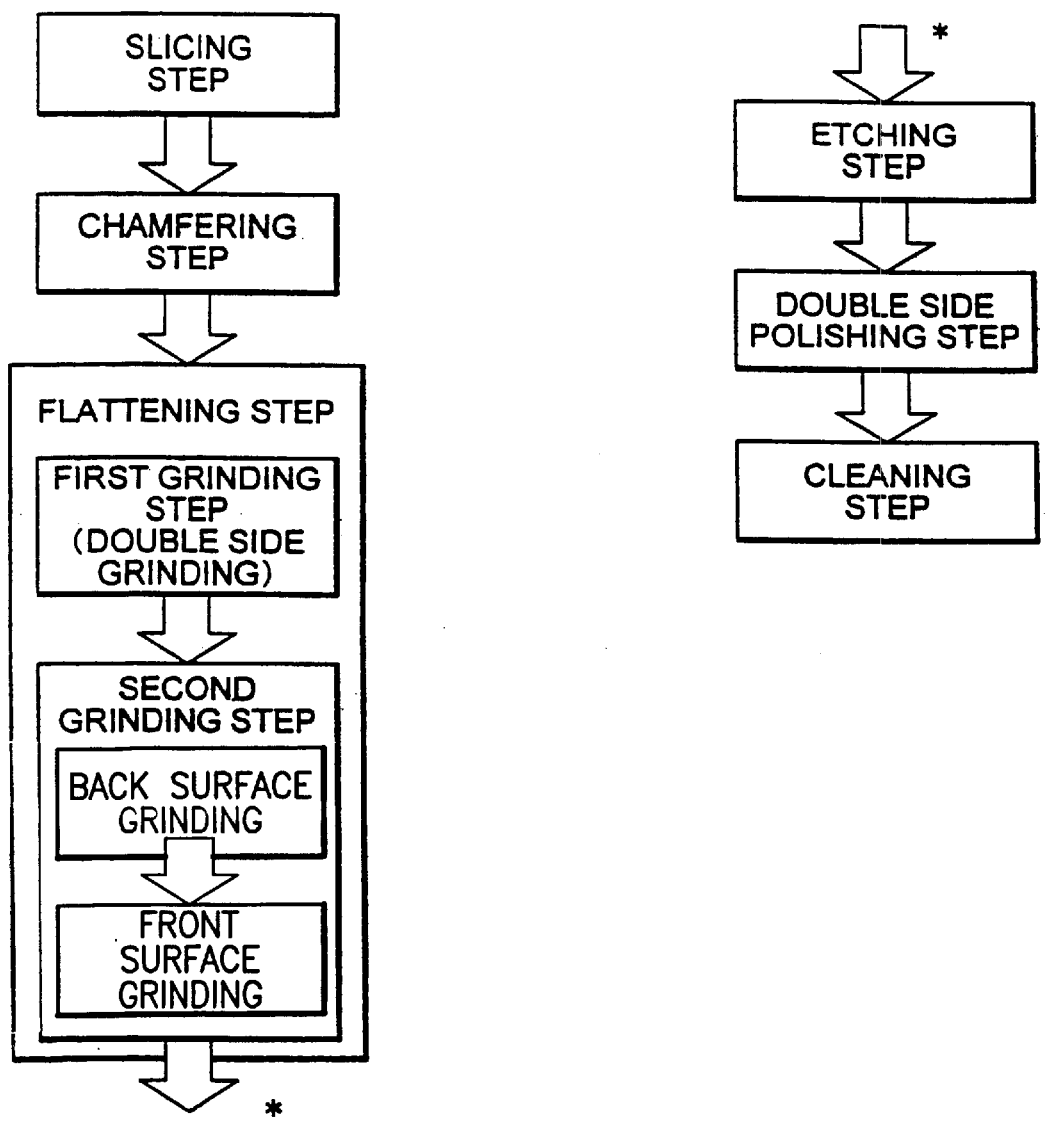
FIG. 11 is a flowchart representing a production process of the conventional surface grinding/double side polishing method.

Further, in the method for single side polishing by using a vacuum sucking type polishing apparatus 30 shown in FIG. 9, a wafer W is fixed on its back surface to a vacuum sucking type rotatable holding member 31 without using wax, and only the front surface of the wafer W is subjected to mechanical chemical polishing in the same manner as described above.

There is also a method for holding a wafer on its back surface with a soft resin without using wax. Any of methods including those mentioned above may be used for the present invention, and the method of single side polishing is not limited to those mentioned above.

In the cleaning step, a cleaning treatment is performed by using SC-1 mainly composed of aqueous ammonia and aqueous hydrogen peroxide, SC-2 mainly composed of hydrochloric acid and aqueous hydrogen peroxide or the like in order to remove the polishing agent and so forth adhered to the surface of wafer obtained from the aforementioned single side polishing step and improve cleanliness of the front surface and back surface of the wafer.

(Test 3)

Figure 7:
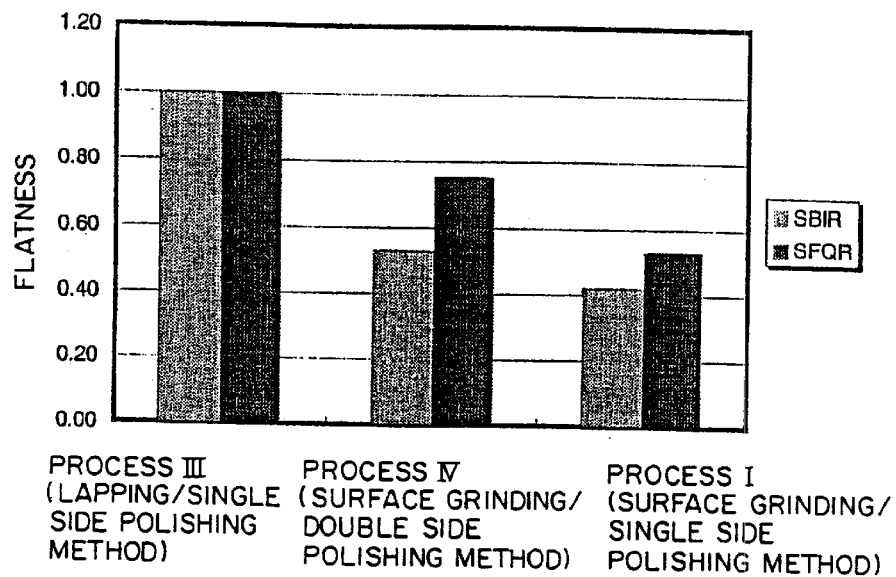
FIG. 7 is a graph comparing flatness of a wafer obtained by the surface grinding/one side polishing method of the present invention and flatness of a wafer obtained by the conventional lapping/single side polishing method or surface grinding/double side polishing method.

Flatness of the final product obtained by Process I (surface grinding/single side polishing method) of the present invention was measured, and the results are shown in FIG. 7 comparing with flatness obtained by conventional production methods.

The conventional production methods were Process III (lapping/single side polishing method) and Process IV (surface grinding/double side polishing method).

The flatness of the wafers was measured by an electrostatic capacitance type thickness gage (U/G9700 produced by ADE Co.), and evaluated as values of SBIRmax (Site Back-side Ideal Range: a value standardized by SEMI standard M1 etc., cell size 25×25) and SFQR (Site Front-side Least-square Range).

While the flatness obtained by Process III was at levels of 0.44 $\mu$m in terms of SBIRmax and 0.23 $\mu$m in terms of SFQR, the flatness obtained by Process I was 0.19 $\mu$m in terms of SBIRmax and 0.12 $\mu$m in terms of SFQR, and thus markedly improved.

The values of flatness shown in FIG. 7 were represented with relative values based on the flatness obtained by Process III, which was taken as 1. These results show that the flatness obtained by the surface grinding/single side polishing method of the present invention was much more excellent as compared with that obtained by the conventional methods.

As explained above, by processing a wafer material according to the steps of Process I or Process II, it can be finished to be a semiconductor wafer having desired high flatness, front surface of high glossiness and back surface of low glossiness.

The present invention is not limited to the embodiments described above. The above-described embodiments are mere examples, and those having the substantially same structure as that described in the appended claims and providing the similar functions and advantages are included in the scope of the present invention.

For example, while silicon wafers having a diameter of 200 mm (8 inches) were processed in the embodiments of the present invention explained above, the present invention can sufficiently be applied to recently used wafers having a diameter of 250 mm (10 inches) to 400 mm (16 inches) or larger.

Figure 2:
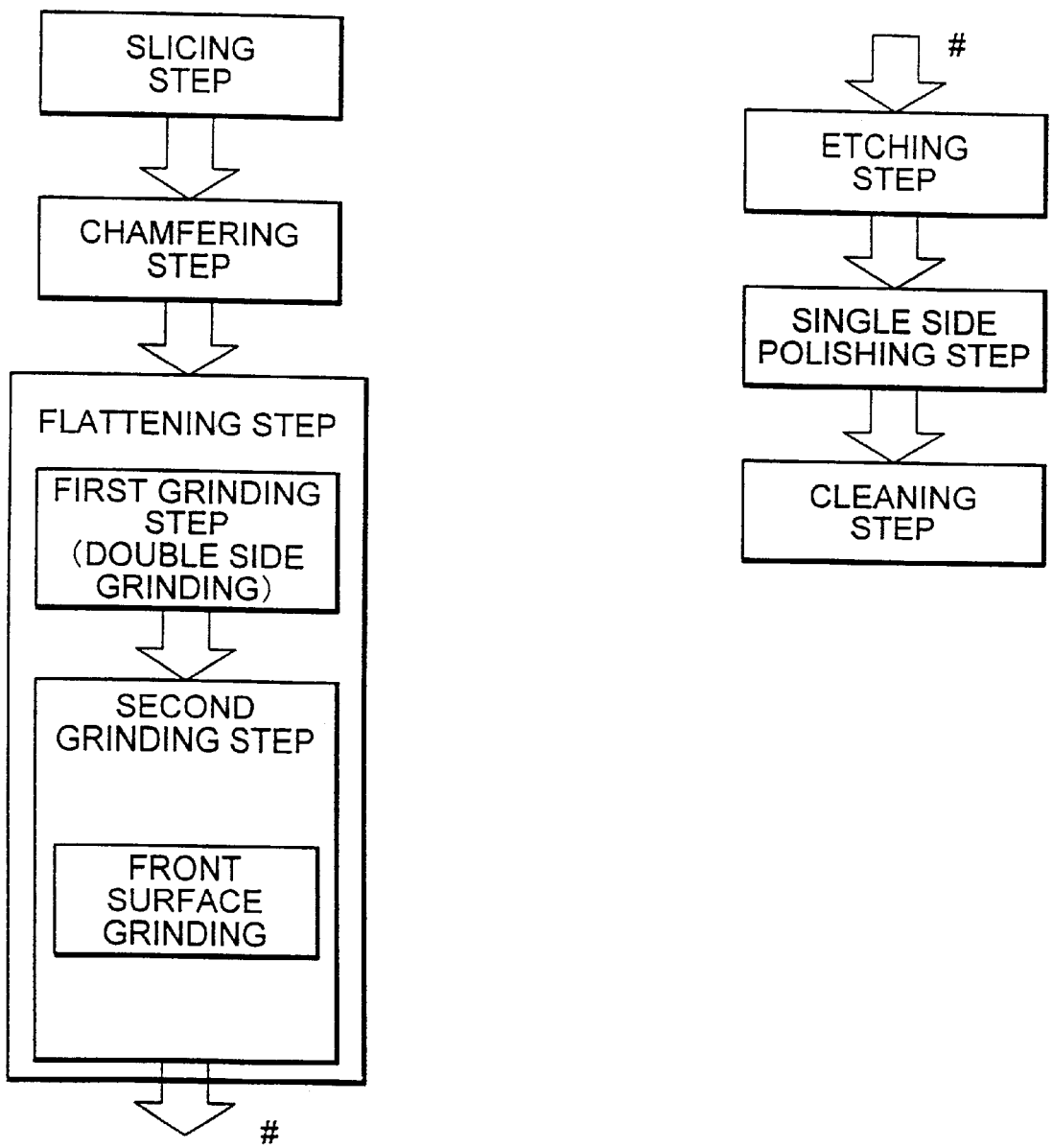
FIG. 2 is a flowchart explaining another production process for producing a semiconductor wafer from a semiconductor ingot according to the present invention.

Although the process steps of the present invention were exemplified by referring to those mentioned in FIGS. 1 and 2, the steps of the present invention are not limited to those mentioned herein. In addition to those steps, steps of heat treatment, cleaning and so forth may be further added, or omission of some steps may be also possible.

What is claimed is:

1. A semiconductor wafer obtained by a process comprising at least flattening both sides of the wafer by surface grinding means, eliminating a mechanically damaged layer by an etching treatment, and then subjecting the wafer to a single side polishing treatment, wherein only a front surface of the wafer is subjected to the single side polishing treatment and a back surface of the wafer has glossiness in a range of 20–80%.

2. A method for producing a semiconductor wafer, which comprises at least cutting out a wafer by slicing a semiconductor ingot, simultaneously grinding both of front surface and back surface of the wafer, then flattening the wafer by surface grinding means for separately grinding the front surface and the back surface under different conditions, removing a mechanically damaged layer by an etching treatment while maintaining flatness, and then subjecting the wafer to a single side polishing treatment, wherein only the front surface of the wafer is subjected to the single side polishing treatment.

3. A method for producing a semiconductor wafer, which comprises at least cutting out a wafer by slicing a semiconductor ingot, simultaneously grinding both of front surface and back surface of the wafer, then flattening the surface by surface grinding means for grinding only the front surface under a condition different from the condition for the simultaneous grinding of both of the front surface and the back surface, removing a mechanically damaged layer by an etching treatment while maintaining flatness, and then subjecting the wafer to a single side polishing treatment, wherein only the front surface of the wafer is subjected to the single side polishing treatment.

4. The method for producing a semiconductor wafer according to claim 2, wherein, as the grinding means, there is used a double head grinding apparatus which can simultaneously grind both of the front surface and the back surface of the wafer, and a surface grinding apparatus which can grind the front surface and the back surface of the wafer with distinct conditions.

5. The method for producing a semiconductor wafer according to claim 3, wherein, as the grinding means, there is used a double head grinding apparatus which can simultaneously grind both of the front surface and the back surface of the wafer, and a surface grinding apparatus which can grind the front surface and the back surface of the wafer with distinct conditions.

6. The method for producing a semiconductor wafer according to claim 2, wherein the wafer is subjected to chamfering before the surface grinding of the both sides.

7. The method for producing a semiconductor wafer according to claim 3, wherein the wafer is subjected to chamfering before the surface grinding of the both sides.

8. The method for producing a semiconductor wafer according to claim 4, wherein the wafer is subjected to chamfering before the surface grinding of the both sides.

9. The method for producing a semiconductor wafer according to claim 5, wherein the wafer is subjected to chamfering before the surface grinding of the both sides.

10. The method for producing a semiconductor wafer according to claim 2, wherein the etching treatment is wet etching using an alkali solution as an etching solution.

11. The method for producing a semiconductor wafer according to claim 3, wherein the etching treatment is wet etching using an alkali solution as an etching solution.

12. The method for producing a semiconductor wafer according to claim 4, wherein the etching treatment is wet etching using an alkali solution as an etching solution.

13. The method for producing a semiconductor wafer according to claim 5, wherein the etching treatment is wet etching using an alkali solution as an etching solution.

14. The method for producing a semiconductor wafer according to claim 6, wherein the etching treatment is wet etching using an alkali solution as an etching solution.

15. The method for producing a semiconductor wafer according to claim 7, wherein the etching treatment is wet etching using an alkali solution as an etching solution.

16. The method for producing a semiconductor wafer according to claim 8, wherein the etching treatment is wet etching using an alkali solution as an etching solution.

17. The method for producing a semiconductor wafer according to claim 9, wherein the etching treatment is wet etching using an alkali solution as an etching solution.

18. The method for producing a semiconductor wafer according to claim 2, wherein a back surface of the wafer has a glossiness in a range of 20–80% upon subjecting the wafer to the single side polishing treatment.

* * * * *